United States Patent [19]
Mizutani

[11] Patent Number: 6,016,186
[45] Date of Patent: *Jan. 18, 2000

[54] ALIGNMENT DEVICE AND METHOD WITH FOCUS DETECTION SYSTEM

[75] Inventor: Shinji Mizutani, Kawasaki, Japan

[73] Assignee: Nikon Corporation, Tokyo, Japan

[ * ] Notice: This patent is subject to a terminal disclaimer.

[21] Appl. No.: 08/953,980

[22] Filed: Oct. 20, 1997

Related U.S. Application Data

[62] Division of application No. 08/409,403, Mar. 24, 1995, Pat. No. 5,721,605.

[30] Foreign Application Priority Data

Mar. 29, 1994 [JP] Japan ........................................ 6-58933

[51] Int. Cl.[7] ............................ G03B 27/42; G01B 11/00
[52] U.S. Cl. ............................................. 355/53; 356/401
[58] Field of Search ........................ 355/53, 55; 356/399, 356/400, 401

[56] References Cited

U.S. PATENT DOCUMENTS

| | | | |
|---|---|---|---|
| 4,710,026 | 12/1987 | Magome et al. | 356/400 X |
| 5,381,210 | 1/1995 | Hagiwara | 355/53 |
| 5,386,269 | 1/1995 | Kosugi | 355/53 X |
| 5,416,562 | 5/1995 | Ota et al. | 355/53 |

FOREIGN PATENT DOCUMENTS 1-161832  6/1989  Japan.

*Primary Examiner*—Fred L. Braun
*Attorney, Agent, or Firm*—Vorys, Sater, Seymour and Pease LLP

[57] ABSTRACT

An alignment device which may include an objective optical system for detecting the light from a first mark formed, for alignment, in a first mark area on a substrate and the light from a second mark formed, for alignment, in a second mark area, a first detection optical system having a first detection area within the viewing field of the objective optical system and adapted to detect the light from the first mark through the objective optical system, a second detection optical system having a second detection area, different from the first detection area, within the viewing field of the objective optical system and adapted to detect the light from the second mark through the objective optical system, and a focus detection system for detecting the deviation of the first mark area with respect to the focal plane of the first detection optical system and the deviation of the second mark area with respect to the focal plane of the second detection optical system, by irradiating the first and second detection areas respective with light beams and receiving the reflected lights therefrom.

19 Claims, 6 Drawing Sheets

ALIGNMENT DEVICE AND METHOD WITH FOCUS DETECTION SYSTEM

This is a division of application Ser. No. 08/409,403 filed Mar. 24, 1995, now U.S. Pat. No. 5,721,605.

BACKGROUND OF THE INVENTION

1. Field of the Invention

The present invention relates to an alignment device and method adapted to be used in various manufacturing or inspecting apparatus such as an exposure apparatus for use in the manufacturing process of semiconductor devices or liquid crystal display devices, or a coordinate measuring apparatus, and more particularly such alignment device provided with a focusing mechanism.

2. Related Background Art

In the manufacturing process of the semiconductor devices and the liquid crystal display devices, there has been employed an alignment device for precisely positioning a wafer, on which the semiconductor devices are formed, or a glass plate on which the liquid crystal display devices are formed, in a desired position by detecting an alignment mark (wafer mark) provided on such wafer or glass plate. In an example of semiconductor device manufacture to be explained in the following, the wafer has to be subjected to 10 to 20 superposed exposures on an exposure apparatus such as an aligner or a stepper, and it has been required to improve the precision of such superposed exposures. The alignment device is composed of an alignment sensor for detecting the positions of the wafer marks and a control system for determining the target position of the wafer, based on thus detected positions.

In such process, it is difficult to detect the positions of all the wafer marks with a single alignment sensor, because the surface coarseness varies depending on the exposures and the subsequent processes, and also because a step difference may exist between the wafer mark and the surrounding surface of the wafer, depending on the layer structure thereon. For this reason, following an alignment sensors are used, depending on the purpose:

1) LSA (laser step alignment) sensor: an alignment sensor system for irradiating the wafer mark with laser beam and measuring the position of the wafer mark by the diffracted or scattered light; utilized widely in various wafer processes;

2) FIA (field image alignment) sensor: a sensor for position measurement by processing the image of a wafer mark, formed by illumination with light of a wide wavelength band obtained for example from a halogen lamp; effective for the measurement of an asymmetrical mark on an aluminum layer or on the wafer surface; and 3) LIA (laser interferometric alignment) sensor: an alignment sensor system for irradiating a wafer mark formed as a diffraction grating with laser beams of slightly different frequencies from two directions and detecting the position of the wafer mark from the phase of the interference light obtained by interference of two diffracted lights generated from said wafer mark; effective for a wafer mark of a small step difference or for a wafer with significant surface coarseness.

These alignment sensors have been selectively utilized depending on the applications.

The optical systems are generally provided with auto focusing mechanisms, and the alignment sensor is also provided with an auto focusing mechanism for maintaining the inspected surface within a predetermined range with respect to the alignment sensor (such function being also called focusing). Such auto focusing mechanism is composed of an auto focusing sensor for irradiating the object wafer mark with detecting light beam and detecting the axial (focus) position of the inspected surface from the reflected light, and a drive mechanism for setting said focus position at a predetermined (in-focus) position. However, even if alignment sensors of plural kinds are provided, there is provided only one auto focusing sensor, for irradiating the predetermined measuring point on the wafer with a light beam for focus position measurement, for common use by these alignment sensors.

Because of the recent increase of the sensors of various kinds incorporated in the exposure apparatus, an efficient arrangement is desired for the accessory devices of the exposure apparatus. For this reason, there has been recently employed an alignment system which incorporates, as disclosed in the Japanese Patent Application Laid-Open No. 5-291109, plural different alignment sensors in a common objective lens.

In such alignment system with plural alignment sensors utilizing a common objective lens, the range of height of the inspected surface (focusing range), in which the position detection can be achieved most precisely, differs slightly among the plural alignment sensors. Consequently, when the wafer surface is set at a height by irradiating a predetermined portion of the wafer with a focus position detecting light beam and utilizing the reflected light in the conventional manner, the optimum surface height for a certain alignment sensor may not be optimum for another alignment sensor, so that some alignment sensors may become incapable of exact position detection.

SUMMARY OF THE INVENTION

An object of the present invention is to provide an alignment device and method capable of exact focusing for alignment sensors, to be used in optical detection of the position of an alignment mark on an object to be aligned.

The above-mentioned object can be attained, according to the present invention, by an alignment device comprising:

an objective optical system for detecting the light from a 1st alignment mark formed in a 1st mark area on a substrate and the light from a 2nd alignment mark formed in a 2nd mark area;

a 1st detection optical system having a 1st detection area in the viewing field of said objective optical system and adapted to detect the light from said 1st mark through said objective optical system;

a 2nd detection optical system having a 2nd detection area, different from said 1st detection area, in the viewing field of said objective optical system and adapted to detect the light from said 2nd mark through said objective optical system; and a focus detection system for irradiating said 1st and 2nd detection areas respectively with light beams and respectively receiving reflected lights, thereby detecting the deviation of said 1st mark area with respect to the focal plane of said 1st detection optical system and the deviation of said 2nd mark area with respect to the focal plane of said 2nd detection optical system.

The above-mentioned configuration allows to respectively detect the deviation of the 1st mark area with respect to the focal plane of the 1st detection optical system and the deviation of the 2nd mark area with respect to the focal plane of the 2nd detection optical system, since a focus detection system is provided for projecting focus detecting light beams respectively on the detection areas of the 1st and 2nd detection optical systems utilizing a common objective optical system.

DESCRIPTION OF THE PREFERRED EMBODIMENTS

In the following there will be explained, with reference to the attached drawings, an embodiment of the alignment device of the present invention. The present embodiment is applied to an alignment system adapted for use in a projection exposure apparatus and having two different alignment sensors which utilize in common an off-axis objective lens.

Figure 1:
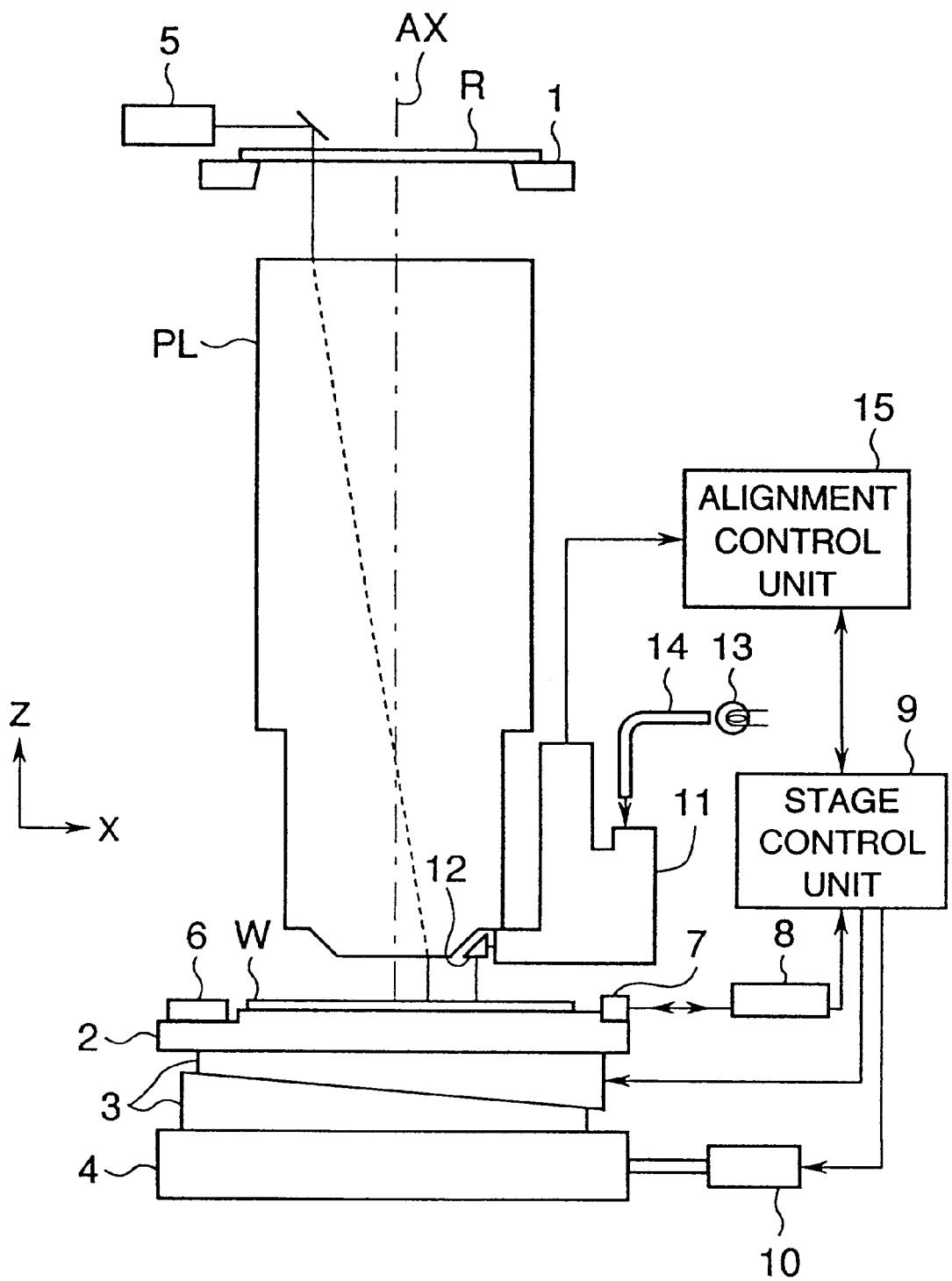
FIG. 1 is a schematic view showing a projection exposure apparatus in which applied is an embodiment of the alignment device of the present invention.

FIG. 1 schematically shows the configuration of a projection exposure apparatus of the present embodiment, wherein a reticle R, to be subjected to exposure operation, is supported on a reticle holder 1 and the pattern of said reticle R is transferred, through a projection optical system PL, onto each of shot areas on a wafer W, by means of exposing light from an unrepresented illumination optical system. The Z-axis is defined parallel to the optical axis AX of the projection optical system PL, and X- and Y-axes are defined, with a plane perpendicular to the Z-axis, respectively in directions parallel and perpendicular to the plane of FIG. 1. The wafer W, coated with photoresist, is placed, by a wafer holder 2, on a Z-stage 3, which is in turn placed on an XY-stage 4. The Z-stage 3 effects fine adjustment of the position of the wafer W in the Z-direction, and the XY-stage 4 effects positioning of the wafer W in the X- and Y-directions.

At an end of the wafer holder 2 there is fixed an L-shaped movable mirror 7, which, in cooperation with a laser interferometer 8, constantly measures the X- and Y-coordinates of the wafer W. The measured coordinates are supplied to a stage control unit 9, which controls the drive amount of the Z-stage 3 based on the focus position information from an alignment control unit 15 to be explained later, thereby focusing the wafer W to each of the alignment sensors. Also the stage control unit 9 controls the function of a drive system 10 for stepped drive of the XY-stage 4, based on the position information of wafer marks (alignment marks) detected by the alignment control unit 15, thereby aligning the center of each shot area, in which the pattern of the reticle R is to be transferred, of the wafer W to the optical axis AX of the projection optical system PL.

On said wafer holder 2 there is provided a reference mark plate 6 bearing various alignment reference marks thereon. Above the reticle R there is provided a reticle alignment microscope 5. Determination of the center position of the projected image of the reticle R (so-called reticle alignment) is achieved by simultaneously observing the alignment mark on the reticle R and a predetermined reference mark on the reference mark plate 6 through said alignment microscope 5 and maintaining the positional deviations of said marks with a predetermined range through the positional adjustment of the reticle R. Subsequently there is measured the baseline amount, which is the amount of deviation between the center of detection of each alignment sensor and the center of the projected image of the reticle R (i.e. the optical axis AX of the projection optical system PL), by detecting the positions of various reference marks on the reference mark plate 6 with the corresponding alignment sensor. Each shot area can be exactly aligned to the exposure position by controlling the X- and Y-coordinates of the wafer W, based on a value obtained by adding said baseline amount to the wafer mark position measured by each alignment sensor.

In the present embodiment, there is provided, at the side of the projection optical system PL, an off-axis alignment system 11 having two alignment sensors, i.e. an FIA (field image alignment) sensor and an LIA (laser interferometric alignment) sensor. The alignment system 11, receiving the illuminating light from an external halogen lamp 13 through optical fibers 14, irradiates the wafer W with different light beams through a prism mirror 12, and the reflected lights from the wafer W return to the alignment system 11 through the prism mirror 12. Various detection signals from the alignment system 11 are supplied to the alignment control unit 15.

Figure 2:
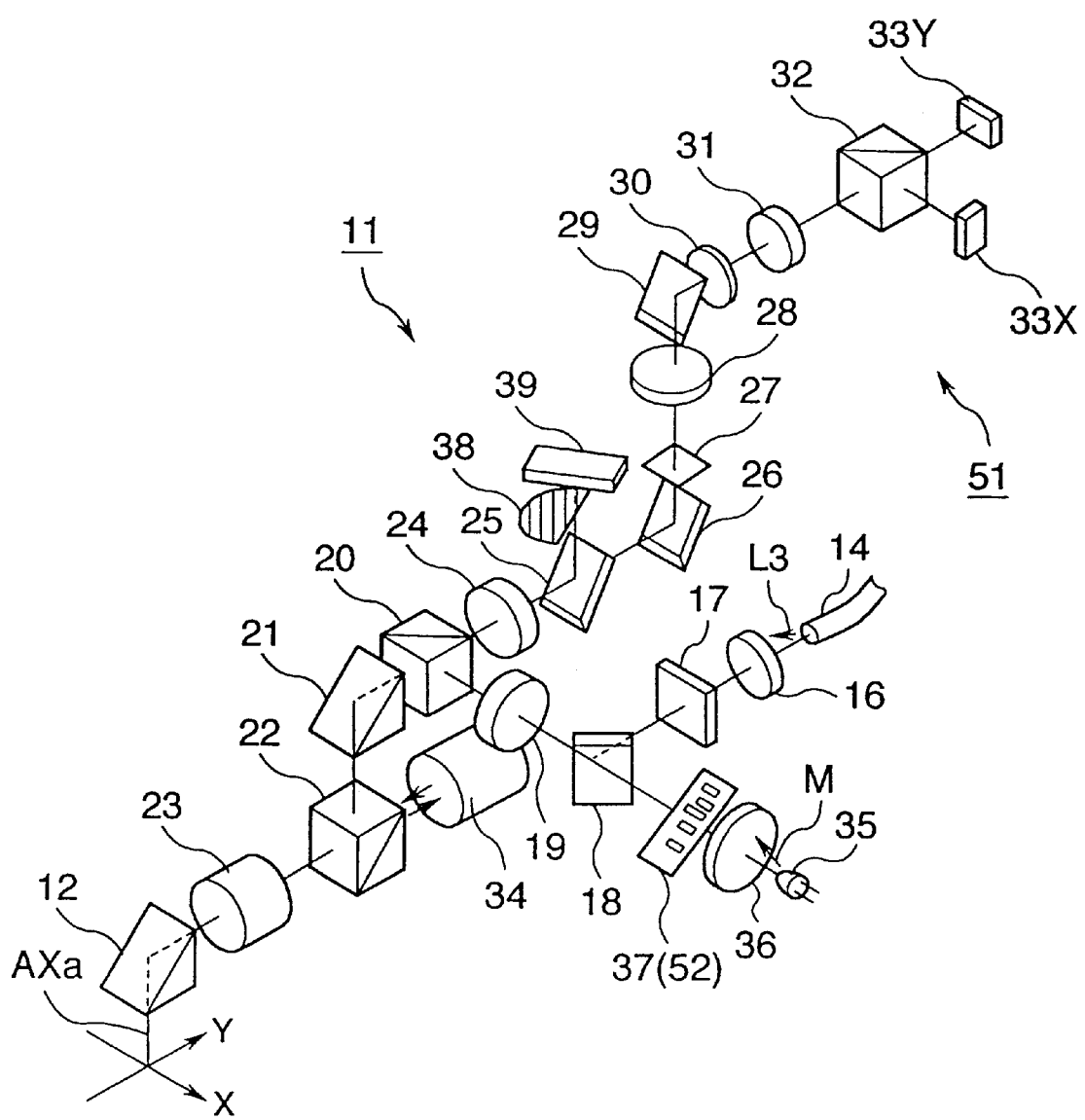
FIG. 2 is a perspective view showing the structure of a multi-purpose alignment system 11 shown in FIG. 1.

FIG. 2 shows the detailed configuration of the alignment system 11 in FIG. 1, wherein the optical fibers 14 emit, for the FIA sensor, illuminating light L3 of a broad band (bandwidth 270 nm or larger), non-actinit to the photoresist on the wafer W. Said illuminating light L3 is transmitted through a condenser lens 16 and illuminates a field diaphragm plate 17 with a uniform intensity. The illuminating light limited by the field diaphragm plate 17 is reflected by a dichroic mirror 18 and enters a beam splitter 20 through a lens system 19. The illuminating light reflected and split by said beam splitter is reflected by a prism mirror 21 and enters a beam splitter 22, and the illuminating light reflected by said beam splitter 22 is guided through an objective lens 23 and the prism mirror 12 and irradiates a predetermined area on the wafer W.

In the above-explained wafer illuminating optical path, the field diaphragm plate 17 is conjugate with the wafer (i.e. in imaging relationship) with respect to a synthesized system consisting of the lens system 19 and the objective lens 23. Also the illuminating area of the FIA system on the wafer W is uniquely determined by the shape and size of an aperture formed on the field diaphragm plate 17.

Within the illuminating light from the optical fibers 14, the light reflected by the wafer (normal reflected light, scattered light etc.) is guided through the prism mirror 12, objective lens 23, beam splitter 22 and prism mirror 21 and returns to the beam splitter 20, and the light transmitted by said beam splitter 20 (about ½ of the returning light) is transmitted by a dichroic mirror 25 and proceeds to a detection system 51 of the FIA sensor. In said detection system 51, the light coming from the dichroic mirror 25 is guided by a mirror 26 and forms an image of the wafer mark on an index plate 27 bearing index marks. The light emerging from said index plate 27 is guided through a phototaking relay lens 28, a mirror 29, a wavelength filter 30 (for intercepting a specified spectral band), a relay lens 31 and a beam splitter 32, thereby forming images of the wafer mark and the index mark respectively on the light-receiving faces of a two-dimensional image sensor 33X for the X-axis and a two-dimensional image sensor 33Y for the Y-axis, respectively composed for example of two-dimensional CCD's. The wavelength filter 30 is used for intercepting the light of a wavelength region same as that of the strong light reflected from the wafer W when the LIA sensor, to be explained later, is in use.

The index plate 27 is so positioned as to be conjugate with the exposed surface of the wafer W with respect to a synthesized system of the objective lens 23 and the lens system 24. Also the index plate 27 is so positioned as to be conjugate with the light-receiving faces of the image sensors 33X, 33Y, with respect to the relay lens systems 28, 31. Said index plate 27 is composed of a transparent substrate on which the index marks are formed for example by a chromium layer, and the images of the wafer marks are formed in transparent portions. The index marks are composed of those for the X-axis and those for the Y-axis. The image sensors 33X, 33Y take the images of the wafer marks for the FIA system and those of the index marks for the X- and Y-axes. The X-coordinate of the wafer mark for the X-axis and the Y-coordinate of the wafer mark for the Y-axis can be determined by processing the image signals from the image sensors 33X, 33Y, thereby detecting the positional relationship between the images of the wafer marks and the index marks. Though not illustrated in FIG. 2, an illumination system is provided independently for illuminating the index plate 27.

In the above-explained configuration, the objective lens 23 and the prism mirror 12 are called the common objective system, which is used in common, in the present embodiment, for the FIA sensor, the LIA sensor and the auto focusing sensor. The lenses of the common objective system and those of the detection system 51 of the FIA sensor after the mirror 26 are positioned coaxially.

Figure 5:
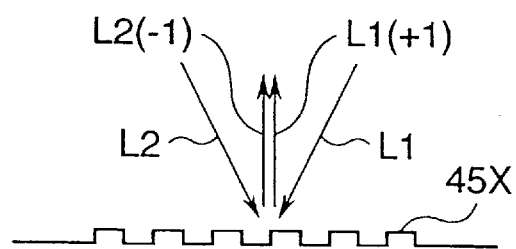
FIG. 5 is a view showing the principle of detection with an LIA sensor.

Again referring to FIG. 2, the reflected light (including scattered light and diffracted light) from the wafer mark formed on the wafer W returns to the beam splitter 22 through the prism mirror 12 and the objective lens 23, and the light transmitted by said beam splitter 22 enters a detection system 34 of the LIA sensor. Said detection system 34 of the LIA sensor provides the beam splitter 22 with a pair of laser beams to each of the X- and Y-axes, and the two pairs of laser beams transmitted by said beam splitter are guided through the objective lens 23 and the prism mirror 12 and respectively irradiate the wafer marks of a diffraction grating pattern for the X-axis and those for the Y-axis provided on the wafer W. Thus, as exemplified in FIG. 5, a wafer mark 45X of diffraction grating pattern is irradiated with the laser beams L1, L2 of different frequencies, from two symmetrical directions.

The wafer marks of the diffraction grating pattern generate, by the irradiation with said two laser beams, two diffracted lights L1(+1), L2(−1) in a same direction. The two diffracted lights from said wafer mark mutually interfere, and the resulting interference light enters the detection system 34 of the LIA system, which effects photoelectric conversion on the interference light and detects the phase of thus obtained beat signal. This phase information is supplied, as the positional information of the alignment mark in the X-direction, to the alignment control unit 15. Similar operations are conducted for the Y-axis. Thus the detection system 34 of the LIA sensor is provided with a light emitting system for irradiating the wafer, under predetermined optical conditions, with two laser beams for the X-axis and two laser beams for the Y-axis, or four laser beams in total, through the objective lens 23, and a light receiving system for photoelectrically detecting, independently, the interference light from the wafer mark for the X-axis and that for the Y-axis. The details of such LIA sensor are disclosed in the U.S. Pat. No. 4,710,026 and the U.S. patent application Ser. No. 418,260 filed on Oct. 6, 1989.

In the following there will be given an explanation on the auto focusing sensor of the present embodiment. Detecting light M, emitted from a light source 35 for auto focusing, such as an LED or a laser diode, enters a slit plate 37 bearing a focus detecting pattern, through a condenser lens 36. The detecting light M transmitted by the focus detecting pattern of the slit plate 37 is guided through a dichroic mirror 18 and a lens system 19 to a beam splitter 20. Said detecting light M is so selected that the wavelength range thereof is non-actinit to the photoresist on the wafer W, for example in a wavelength region from red to near infrared. The dichroic mirror 18 has such wavelength selectivity as to reflect, within the illuminating light L3 from the optical fibers 14, the light of a wavelength region used for position detection and to transmit, within the detecting light M, the light of a wavelength region used for focus detection. Thus the position detecting light and the focus detecting light, irradiating the wafer W, have mutually different wavelength regions in order to avoid undesirable effect.

The focus detecting light reflected by the beam splitter 20 is guided through the prism mirror 21, beam splitter 22, objective lens 23 and prism mirror 12, and irradiates the wafer W. The slit plate 37 is substantially conjugate with the exposed surface of the wafer W with respect to the lens system 19 and the objective lens 23, whereby an image or a defocused image of the focus detecting pattern 40 of the slit plate 37 is projected onto the exposed surface of the wafer W. The light reflected by the exposed surface of the wafer W is guided through the prism mirror 12, objective lens 23, beam splitter 22 and prism mirror 21 and returns to the beam splitter 20, and the light transmitted by the beam splitter 20 proceeds to a dichroic mirror 25 through a lens system 24.

Said dichroic mirror 25 has such wavelength selectivity, contrary to that of the dichroic mirror 18, as to transmit the position detecting light emitted from the optical fibers 14 and to reflect the focus detecting light emitted from the light source 35. Consequently the focus detecting light reflected by the dichroic mirror 25 enters a line sensor 39, composed for example of a one-dimensional CCD, through the outside of a pupil-limiting light shield plate 38 provided for destructing the telecentricity at the image side. On said line sensor 39 there is formed an image (or a defocused image) of the focus detecting pattern projected onto the wafer W. Stated differently, the exposed surface of the wafer W and the light-receiving face of the line sensor 39 are mutually substantially conjugate with respect to the objective lens 23 and the lens system 24. In order to avoid entry of stray laser light in the use of the LIA sensor, a wavelength filter plate 30 is preferably provided between the dichroic mirror 25 and the lens system 24.

Figure 3:
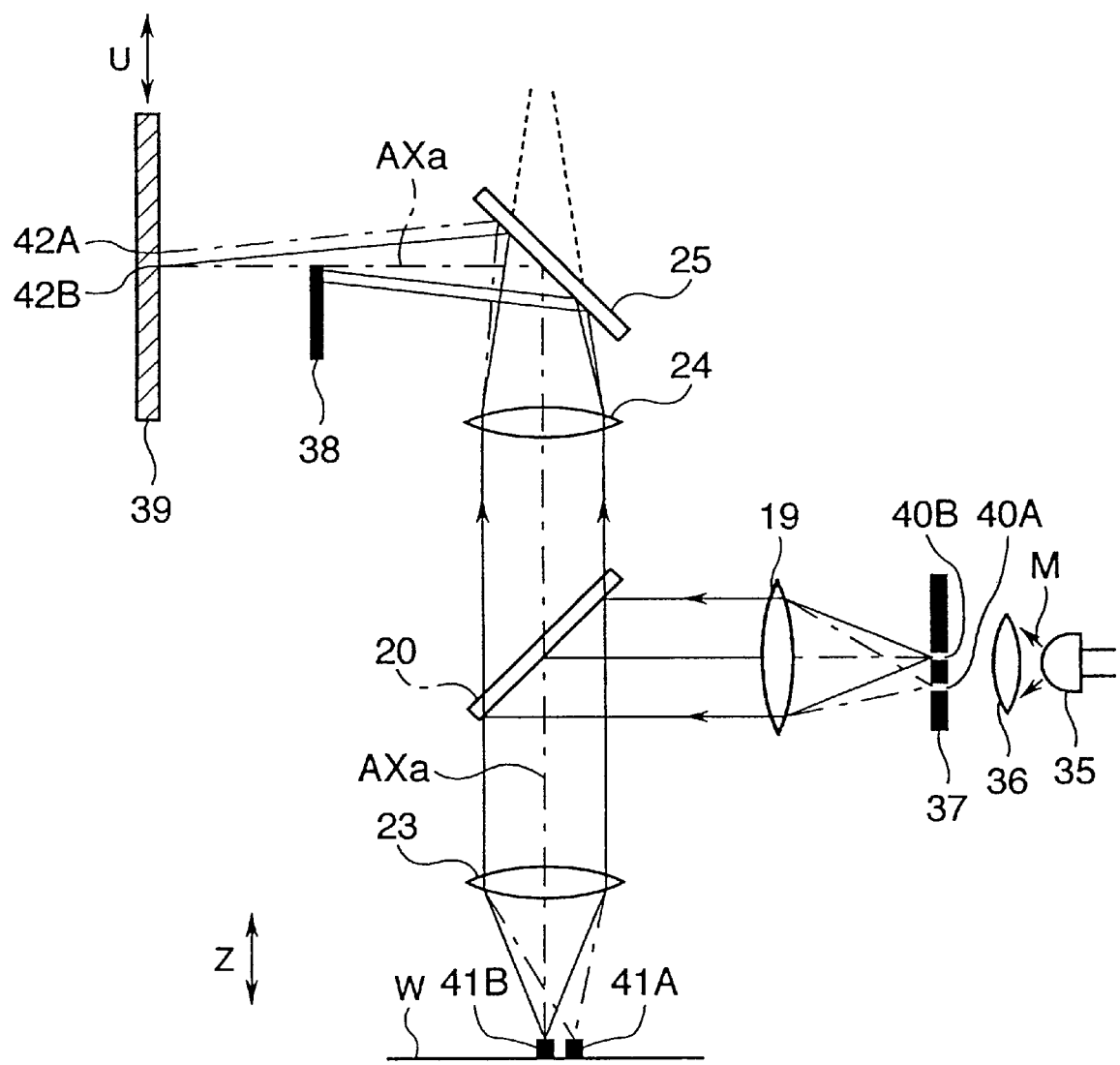
FIG. 3 is a schematic view of an auto focusing sensor of said embodiment.

In the following there will be explained, with reference to FIG. 3, the auto focusing sensor of the present embodiment. FIG. 3 illustrates the auto focus sensor only, in the configuration shown in FIG. 2, however without the optical path folding mirrors and the like shown in FIG. 2. Referring to FIG. 3, the slit plate 37 bears five focus detecting patterns 40A, 40B, . . . of which only two are illustrated in FIG. 3.

Images 41A, 41B, . . . of said focus detecting patterns 40A, 40B, . . . are projected onto the wafer W through the lens system 19 and the objective lens 23, and the reflected light from the wafer W enters the line sensor 39 through the objective lens 23, lens system 24, dichroic mirror 25 and light shield plate 38, whereby images 42A, 42B, . . . are projected onto said line sensor 39.

On the line sensor 39, the images 42A, 42B, . . . are projected in respectively different positions along a predetermined direction (defined as direction U). The pupil-limiting light shield plate 38 serves to shield a half area lower than the optical axis AXa, in the direction U. The above-explained optical system is telecentric at the wafer side from the objective lens 23, but is non-telecentric at the line sensor side from the lens system 24, because of the function of the light shield plate 38. Consequently, if the wafer W is displaced parallel to the optical axis AXa (in the Z-direction), the positions of the images 41A, 41B, . . . of the focus detecting patterns do not change on the wafer W (though said images being defocused), but the images 42A, 42B, . . . on the line sensor 39 are displaced along the direction U as indicated by an arrow. Thus the position of a measured point on the wafer W in the Z-direction (i.e. focus position) can be detected from the amount of lateral displacement of the image in the direction U on the line sensor 39.

Figure 4:
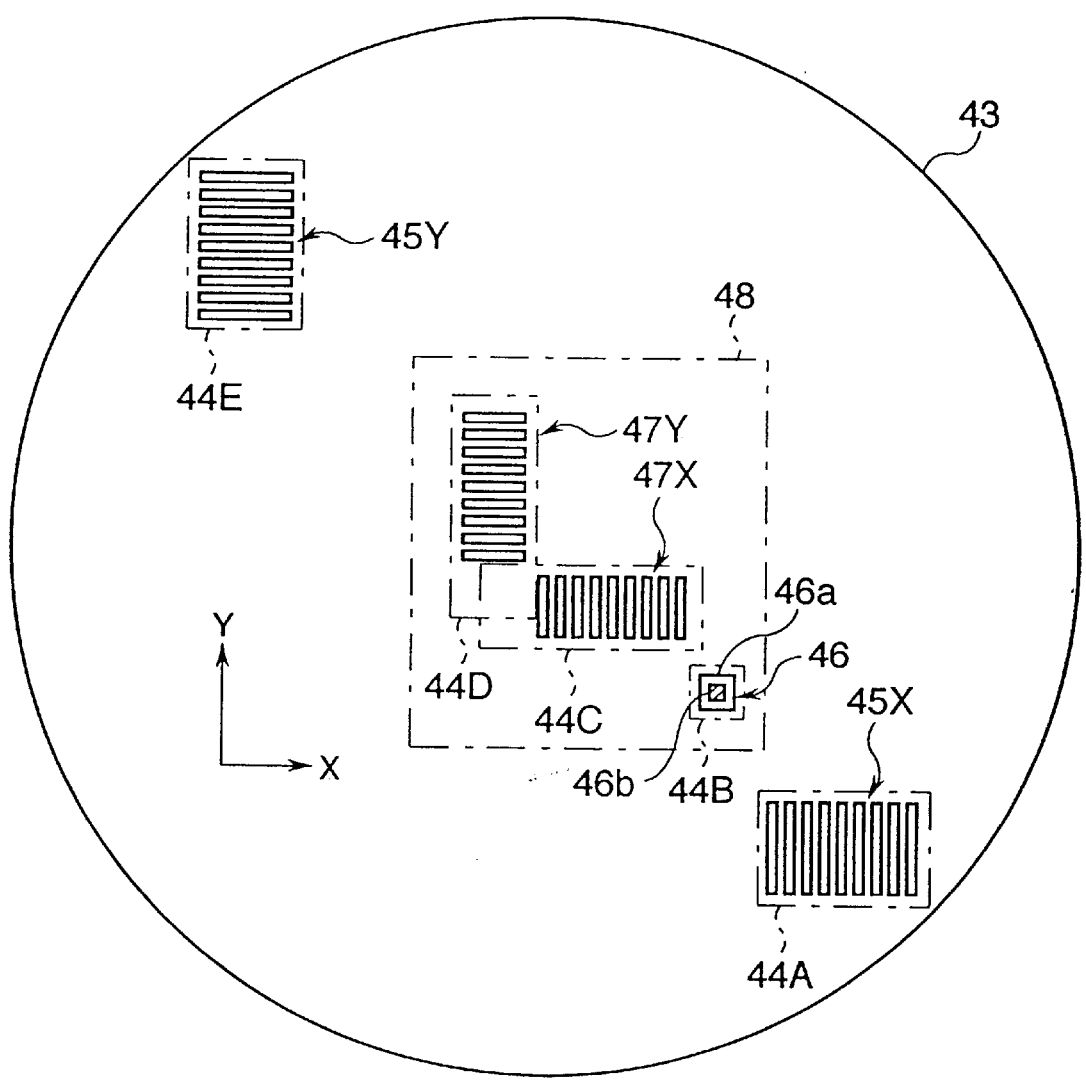
FIG. 4 is a magnified plan view showing detection areas of plural alignment sensors, provided in the viewing field of the objective lens.

Now there will be explained, with reference to FIG. 4, an example of the viewing fields on the wafer W, to be respectively detected by the FIA sensor and the LIA sensor through the objective lens 23. In FIG. 4, a circular area represents the viewing field 43 of the objective lens 23 on the wafer, and, within said viewing field 43 there are defined five detection areas 44A to 44E.

Detection areas 44A and 44E are the detection areas for the LIA sensor, and the area 44A is irradiated with the two light beams of the LIA system, for detection in the X-direction, while the area 44E is irradiated with the two light beams of the LIA system, for detection in the Y-direction.

Detection areas 44B, 44C and 44D are those for the FIA sensor. A rectangular area 48 in the viewing field 43 represents the image taking area of the image sensors 33X, 33Y. The detection area 44C is subjected to image analysis by the image sensor 33X, while the detection area 44D is subjected to image analysis by the image sensor 33Y. Also the detection area 44B is subjected to image analysis by the image sensors 33X and 33Y, for measuring the wafer registration.

In the detection areas 44A to 44E in FIG. 4, there are tentatively shown wafer marks to be respectively detected in said areas.

More specifically, in the detection area 44A, there is detected a wafer mark 45X of a diffraction grating pattern (hereinafter called diffraction grating mark) having a predetermined pitch in the X-direction, for the LIA sensor, and, in the detection area 44E, there is detected a diffraction grating mark 45Y having a predetermined pitch in the Y-direction. In the detection area 44C there is detected a line-and-space (L/S) pattern 47X having a predetermined pitch in the X-direction, and, in the detection area 44D there is detected an L/S pattern 47Y having a predetermined pitch in the Y-direction. Also in the detection area 44B, a box-in-box wafer mark 46 is detected.

Figure 8:
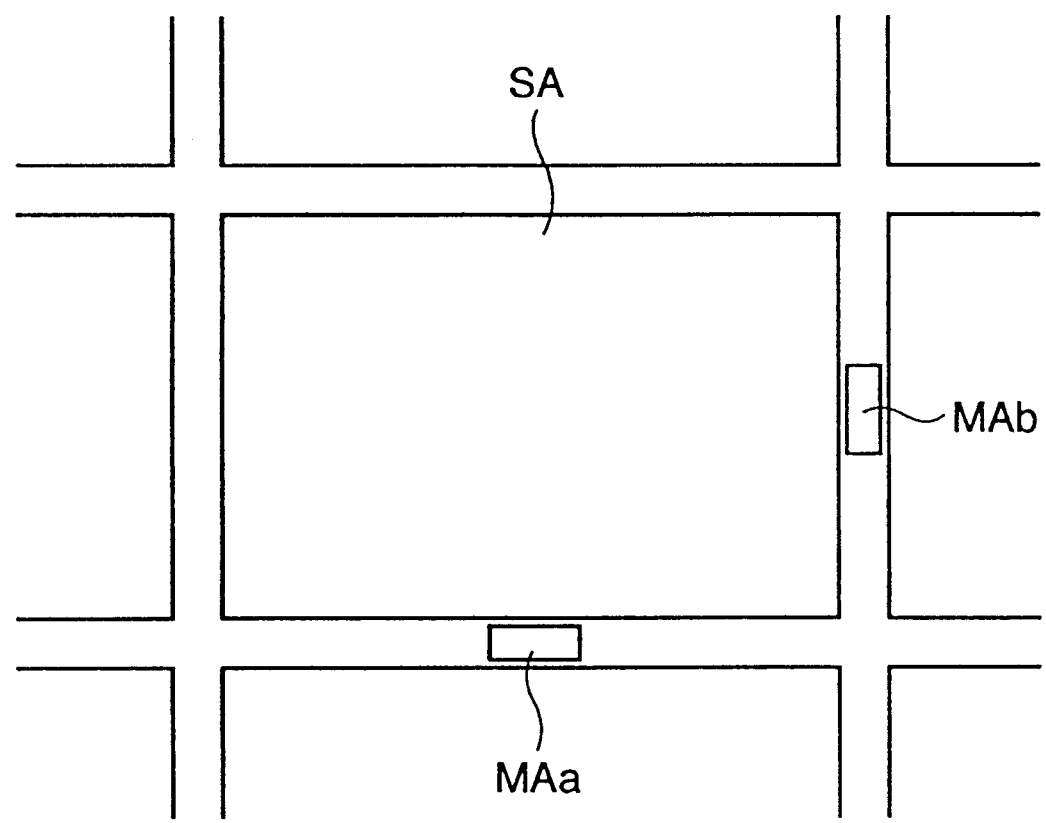
FIG. 8 is a magnified view showing an example of a wafer area where the alignment marks are formed.

The above-mentioned diffraction grating marks 45X, 45Y, L/S patterns 47X, 47Y and mark 46 are respectively formed, for example as shown in FIG. 8, in mark areas MAa, MAb positioned between the plural shot areas SA on the wafer.

The registration measurement can be achieved, based on the image signals from the image sensors 33X. 33Y (see FIG. 2) of the FIA sensor, by detecting the positional relationship between the images of the outer box 46a and the inner box 46b and determining the positional deviation between the outer box 46a and the inner box 46b.

Figure 6:
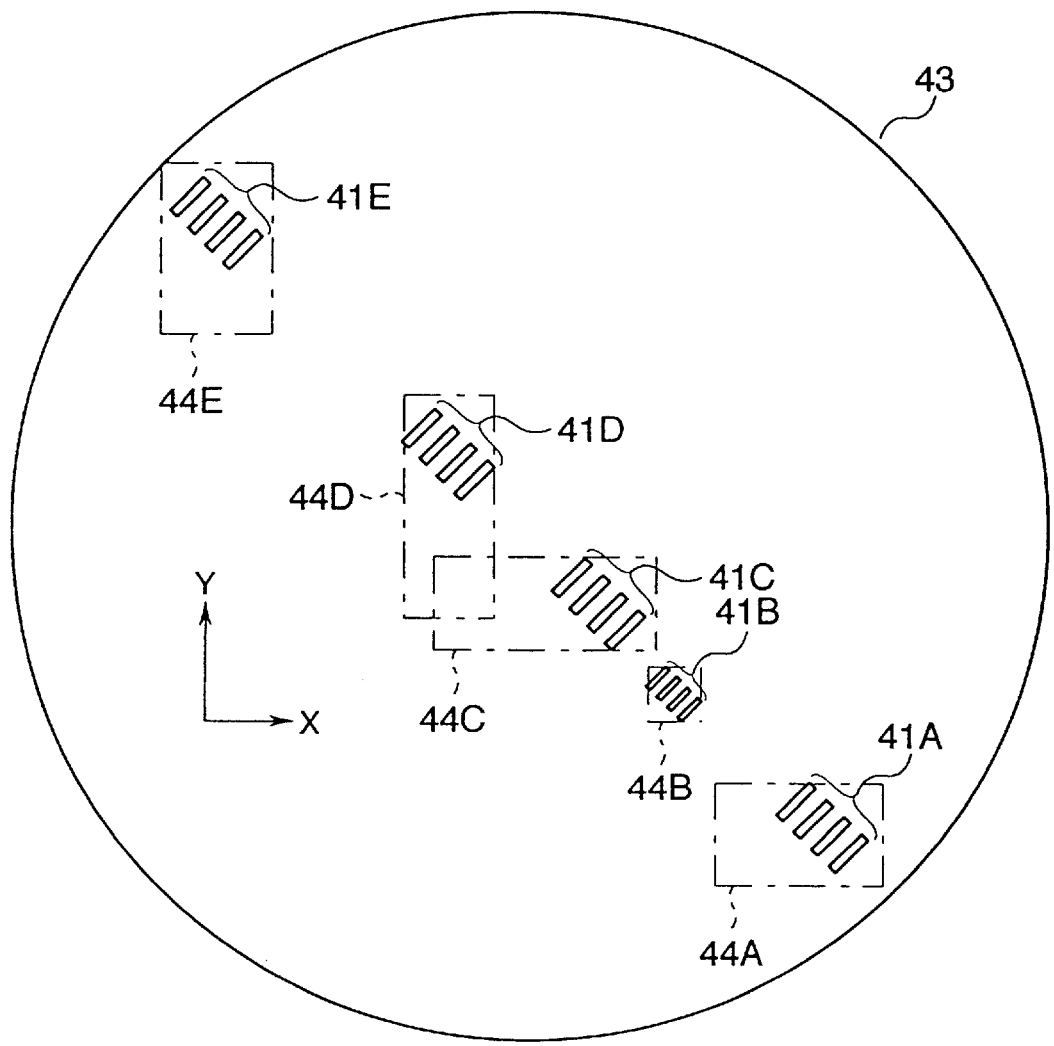
FIG. 6 is a magnified plan view showing the images of a focus detecting pattern, projected respectively on the detection areas shown in FIG. 4.

FIG. 6 shows the images 41A to 41E of the focus detecting patterns, respectively projected in the detection areas 44A to 44E in the viewing field 43. As illustrated in FIG. 6, the focus detecting pattern images 41A to 41E, projected on the detection areas 44A to 44E, are light-and-dark patterns (multiple patterns) having a predetermined pitch in a direction of 45° to the X-axis.

Since these patterns are so formed as to cross the wafer marks to be detected in these detection areas, the influence of said wafer marks on the focus detection can be alleviated. The focus detecting pattern can also be composed of a single slit pattern.

Figure 7:
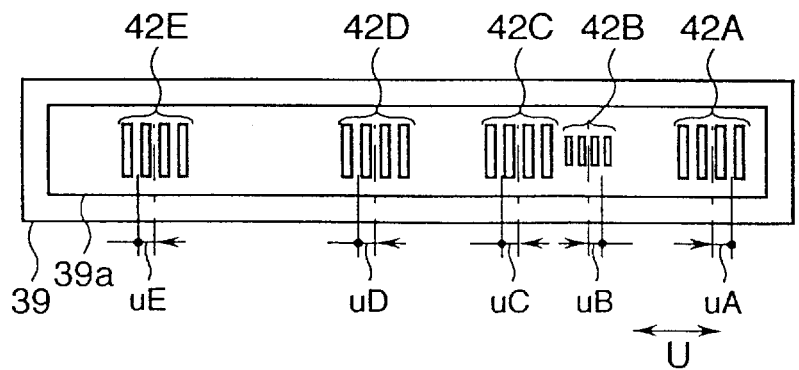
FIG. 7 is a magnified view of images of a focus detecting pattern, projected on a line sensor 39.

FIG. 7 illustrates the focus detecting pattern images 42A to 42E reprojected on the light-receiving face 39a of the line sensor 39 (see FIG. 3), corresponding respectively to the focus detecting pattern images shown in FIG. 6. In FIG. 7, photosensor elements are arranged, along the direction U, on said light-receiving face 39a of the line sensor 39, and the images 42A to 42E of the focus detecting patterns are projected in respectively different positions along the direction U. As each of said images 42A to 42E is composed of a light-and-dark pattern having a predetermined pitch in the direction U, the positions of said images 42A to 42E along said direction U can be determined by processing the image signals, obtained from the line sensor 39, in the alignment control unit 15 (see FIG. 1).

The amount of positional deviation, in the Z-direction, of a wafer area bearing the diffraction grating mark 45X (see FIG. 4) can be detected by determining the amount of positional deviation uA of the image 42A with respect to a reference position, in the direction U. Also the amount of positional deviation, in the Z-direction, of a wafer area bearing the wafer mark 46 (see FIG. 4) can be detected by determining the amount of positional deviation uB of the image 42B with respect to the reference position in the direction U. Furthermore, the amount of positional deviation, in the Z-direction, of a wafer area bearing the L/S pattern 47X (see FIG. 4) can be detected by determining the amount of positional deviation uC of the image 42C with respect to the reference position in the direction U. The amount of positional deviation, in the Z-direction, of a wafer area bearing the L/S pattern 47Y (see FIG. 4) can be detected by determining the amount of positional deviation uD of the image 42D with respect to the reference position in the direction U. The amount of positional deviation, in the Z-direction, of a wafer area bearing the diffraction grating mark 45Y (see FIG. 4) can be detected by determining the amount of position deviation uE of the image 42E with respect to the reference position in the direction U.

Now there will be briefly explained an example of the method of determination of the reference position on the line sensor 39.

In case of the FIA sensor, the reference mark of the reference mark plate 6 (cf. FIG. 1) is positioned for example in the detection area 44C, and said reference mark is taken by the image sensor 33X while said reference mark plate 6 is moved in the Z-direction. Then the image signal from said image sensor 33X is analyzed and the position of the reference mark plate 6 in the Z-direction is so determined that the contrast of the image of said reference mark becomes highest. Then the image 41C of the focus detecting pattern is projected on the reference mark plate 6, and the pattern image 42C is projected on the line sensor 39. The position of said pattern image 42C in this state on the line sensor 39 is taken as the reference position for the pattern image 42C. The reference positions can be determined in a similar manner for the pattern images 42B and 42D.

In case of the LIA sensor, the reference mark of the reference mark plate 6 is positioned for example in the detection area 44A, and the reference mark is irradiated with the two laser beams while the reference mark plate 6 is moved in the Z-direction. Then the interference light from the reference mark is detected, and the position of the reference mark plate in the Z-direction is so determined that the beat signal of the interference light has the largest amplitude. Then the image 41A of the focus detecting pattern is projected on the reference mark plate 6, and the image 42A is projected on the line sensor 39. The position of the pattern image 42A in this state on the line sensor 39 is defined as the reference position of the pattern image 42A. The reference position can be determined in a similar manner for the pattern image 42E.

The line sensor 39 may also be replaced by a two-dimensional image sensor, having pixels of plural lines along the direction U. In such case the position of the pattern image on the sensor can be determined by adding the image signals of the pixels of said plural lines.

It is also possible to place, in front of the light-receiving face of the line sensor 39, a cylindrical lens having light-condensing function in a direction perpendicular to the direction U shown in FIG. 7.

The amounts of positional deviation of the mark bearing areas on the wafer, from the in-focus position, are represented by $1/\beta^2$ of the lateral deviations uA to uE shown in FIG. 7, wherein $\beta$ is the (lateral) image magnification of the synthesized system, consisting of the objective lens 23 and the lens system 24, from the wafer W to the line sensor 39. Consequently, for detecting the X- and Y-coordinates of the wafer mark on the wafer, the position detection is executed after the position of the Z-stage 3, shown in FIG. 1, is adjusted for each alignment sensor to be used. In this manner the position of the wafer mark can be detected in highly precise manner, in an accurately focused state, for each of the FIA sensor and the LIA sensor. Also for improving the precision of focusing, auto focusing by a servo system may be conducted also during the position measurement by the alignment sensor. Besides, in case wafer marks (for example 45X and 45Y) are present at the same time in plural detection areas (for example 44A and 44E) in the viewing field of the objective optical system, the focus positions can be simultaneously detected for said marks, so that the detection time required for the detection of the positions of the wafer marks can be shortened.

If it is only required, for example in FIG. 4, to detect the focus position in the detection area 44A, the focus detecting patterns may be shielded by an unrepresented shutter, except for the pattern 40A shown in FIG. 3. This method enables exact focus detection without the influence of the stray light from the projected images of other focus detecting patterns. Also in place for such shutter, there may be provided light sources for respectively illuminating the focus detecting patterns 40A, 40B, . . . and these light sources may be suitably controlled to only illuminate a specified focus detecting pattern.

Furthermore, it is also possible to replace, as shown in FIG. 2, the slit plate 37 with a liquid crystal display panel 52 for generating the focus detecting patterns. This method enables easy optimization of the shape of the focus detecting patterns according to the shape of the wafer marks to be detected, and allows to erase unnecessary focus detecting patterns.

Furthermore, instead of the auto focusing sensor shown in FIG. 3, for projecting the images of the focus detecting patterns onto the wafer W through the objective lens 23, there may be provided a light emitting system, different from the objective lens 23, for projecting plural images 41A, 41B, . . . of the focus detecting patterns obliquely to the optical axis AXa. In such case, the focus positions of the corresponding mark-bearing areas can be detected by receiving the light reflected from the wafer W with a light-receiving system positioned substantially symmetrically to said light-emitting system to re-focus the images of the focus detecting patterns and determining the amounts of lateral deviations of thus re-focused images.

In the configuration shown in FIG. 2, the image sensors 33X, 33Y are so designed as to take the image of a same area within the viewing field of the objective lens, and to effect image analysis in the different portions in said image taking area, but said image sensors 33X, 33Y may have mutually different image taking areas.

Furthermore, the foregoing explanation has explained a case in which the FIA sensor and the LIA sensor are united, but the present invention is naturally applicable also to a case in which united are plural alignment sensors selected from the FIA sensor, the LIA sensor and other alignment sensors (for example LSA sensor). Furthermore, the present invention is applicable in case an alignment sensor of TTL (through-the-lens) system or an alignment sensor of TTR (through-the-reticle) system is united.

What is claimed is:

1. An alignment device comprising:
   an objective optical system which is provided to detect light from an alignment mark formed in a mark area on a substrate;
   a detection optical system having a detection area within a view field of said objective optical system to detect said alignment mark through said objective optical system; and
   a focus detection system which projects any pattern of a plurality of patterns selectively onto said detection area and receives a projected image of the projected pattern through said objective optical system to detect a deviation of said mark area with respect to a focal plane of said detection optical system.

2. An alignment device according to claim 1, wherein said any pattern is projected onto said detection area through said objective optical system.

3. An exposure apparatus which transfers a pattern of a mask on a substrate, comprising:
   a projection optical system, disposed between said mask and said substrate, which projects an image of said pattern of said mask on said substrate;
   an alignment system which detects an alignment mark on said substrate;
   an objective optical system, disposed in said alignment system, which detects light from said alignment mark;
   a first detection system, disposed in said alignment system, which has a first detection area within a view field of said objective optical system and which detects said alignment mark through said objective optical system;

a second detection system, disposed in said alignment system, which has a second detection area, different from said first detection area, within the view field of said objective optical system and which detects said alignment mark through said objective optical system;

a focus detection system, disposed in said alignment system, which detects a position of a surface of said substrate along a direction of an optical axis of said objective optical system within each of said first and second detection areas separately; and a substrate movement system, connected to said alignment system, which controls a movement of said substrate based on an output from said alignment system.

4. An exposure apparatus according to claim 3, wherein said objective optical system detects light from said alignment mark that has not passed through said projection optical system.

5. An exposure apparatus according to claim 3, wherein said objective optical system detects light from said alignment mark that has passed through said projection optical system.

6. An exposure apparatus according to claim 3, wherein said objective optical system detects light from said alignment mark that has passed through said mask and said projection optical system.

7. An exposure apparatus according to claim 3, wherein at least one of said first and second detection systems has an image sensor which senses an image of said alignment mark.

8. An exposure apparatus according to claim 3, wherein said alignment mark comprises a diffraction grating and at least one of said first and second detection systems detects said diffraction grating.

9. An exposure apparatus according to claim 3, wherein different sorts of alignment marks formed on said substrate are detected within said first and second detection areas respectively.

10. An exposure apparatus according to claim 9, wherein a plurality of alignment marks formed on said substrate, which are different along detection directions, are detected within said first and second detection areas respectively.

11. An exposure method of transferring a pattern of a mask on a substrate through a projection optical system, comprising:

detecting separately positional information of a surface of said substrate, along a direction of an optical axis of an objective optical system, through said objective optical system and within each of a plurality of detection areas defined in different positions within a view field of said objective optical system, which detects an alignment mark on said substrate;

aligning said substrate in the direction of the optical axis of said objective optical system based on a result of said detecting and measuring positional information of said alignment mark through said objective optical system; and providing an alignment of said substrate based on a result of said measuring and transferring said pattern of said mask on said substrate.

12. An exposure method according to claim 11, wherein said objective optical system detects light from sa id alignment mark that has not passed through said projection optical system.

13. An exposure method according to claim 11, wherein said objective optical system detects light from said alignment mark that has passed through said projection optical system.

14. An exposure method according to claim 11, wherein said objective optical system detects light from said alignment mark that has passed through said mask and said projection optical system.

15. An exposure method according to claim 11, wherein different sorts of alignment marks formed on said substrate are detected within a first detection area and second detection area respectively.

16. An exposure method according to claim 15, wherein a plurality of alignment marks formed on said substrate, which are different along detection directions, are detected within the first detection area and the second detection area respectively.

17. An alignment method, comprising:

detecting separately positional information of a surface of a substrate, along a direction of an optical axis of an objective optical system, through said objective optical system and within each of a plurality of detection areas defined in different positions within a view field of said objective optical system which detects an alignment mark on said substrate;

aligning said substrate along the direction of the optical axis of said objective optical system based on a result of said detecting and measuring positional information of said alignment mark through said objective optical system; and providing an alignment of said substrate based on a result of said measuring.

18. An alignment method, comprising:

detecting positional information of a surface of a substrate, along a direction of an optical axis of an objective optical system, through said objective optical system and within a detection area defined within a view field of said objective optical system which detects an alignment mark on said substrate;

aligning said substrate along the direction of the optical axis of said objective optical system based on a result of said detecting and measuring positional information of said alignment mark through said objective optical system; and providing an alignment of said substrate based on a result of said measurement.

19. An alignment method according to claim 18, further comprising:

projecting any pattern of a plurality of patterns selectively onto the view field of said objective optical system when detecting positional information of the surface of said substrate along the direction of the optical axis of said objective optical system.

* * * * *